United States Patent
Huang et al.

(10) Patent No.: US 8,836,353 B2
(45) Date of Patent: Sep. 16, 2014

(54) DIGITALLY DISPLAYING INSPECTION SYSTEM FOR ESD PROTECTION CHIP

(71) Applicant: Shenzhen China Star Optoelectronics Technology Co., Ltd., Guangdong (CN)

(72) Inventors: Xiaoyu Huang, Shenzhen (CN); Mingfeng Deng, Shenzhen (CN); Jungmao Tsai, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 99 days.

(21) Appl. No.: 13/807,066

(22) PCT Filed: Dec. 1, 2012

(86) PCT No.: PCT/CN2012/085706
§ 371 (c)(1),
(2), (4) Date: Dec. 27, 2012

(87) PCT Pub. No.: WO2014/079099
PCT Pub. Date: May 30, 2014

(65) Prior Publication Data
US 2014/0145738 A1 May 29, 2014

(51) Int. Cl.
*G01R 31/10* (2006.01)
(52) U.S. Cl.
USPC ............................................... 324/750.01
(58) Field of Classification Search
CPC .................................................. G01R 31/2856
USPC ...................................................... 324/750.01
See application file for complete search history.

(56) References Cited

U.S. PATENT DOCUMENTS

| | | | |
|---|---|---|---|
| 5,376,879 A | 12/1994 | Schrimpf et al. | |
| 6,804,724 B2 * | 10/2004 | Shin | 710/2 |
| 7,664,015 B2 * | 2/2010 | Price et al. | 370/229 |

FOREIGN PATENT DOCUMENTS

| | | |
|---|---|---|
| CN | 101398463 A | 4/2009 |
| CN | 102830323 A | 12/2012 |
| JP | 2010191053 A | 9/2010 |
| TW | 539863 B | 7/2003 |

* cited by examiner

*Primary Examiner* — Thomas F Valone
(74) *Attorney, Agent, or Firm* — Andrew C. Cheng (57) ABSTRACT

The present invention provides a digitally displaying inspection system for ESD protection chip, which includes an LVDS connector, a display system, first, second, and the third data lines, a power supply, and a resistor. The first, second, and third data lines each have an end electrically connected to the LVDS connector and an opposite end electrically connected to the display system. The display system includes a logic operation module and a digital display module electrically connected to the logic operation module. The logic operation module is electrically connected to the first, second, and third data lines. When an ESD protection chip is electrically connected to the LVDS connector, the logic operation module samples signals on the first, second, and third data lines and drive, after carrying out logic operations, the digital display module to display character signs, which can identify if the ESD protection chip is incorrectly connected.

11 Claims, 6 Drawing Sheets

DIGITALLY DISPLAYING INSPECTION SYSTEM FOR ESD PROTECTION CHIP

BACKGROUND OF THE INVENTION

1. Field of the Invention

The present invention relates to an ESD (Electrostatic Discharge) protection circuit of liquid crystal LVDS (Low-Voltage Differential Signaling) driving circuit, and in particular to a digitally displaying inspection system for ESD protection chip of liquid crystal LVDS driving circuit.

2. The Related Arts

Thin-film transistor liquid crystal display (TFT-LCD) is one of the main stream product for flat panel displaying and is a vital display platform for modern IT and video products.

Figure 1:
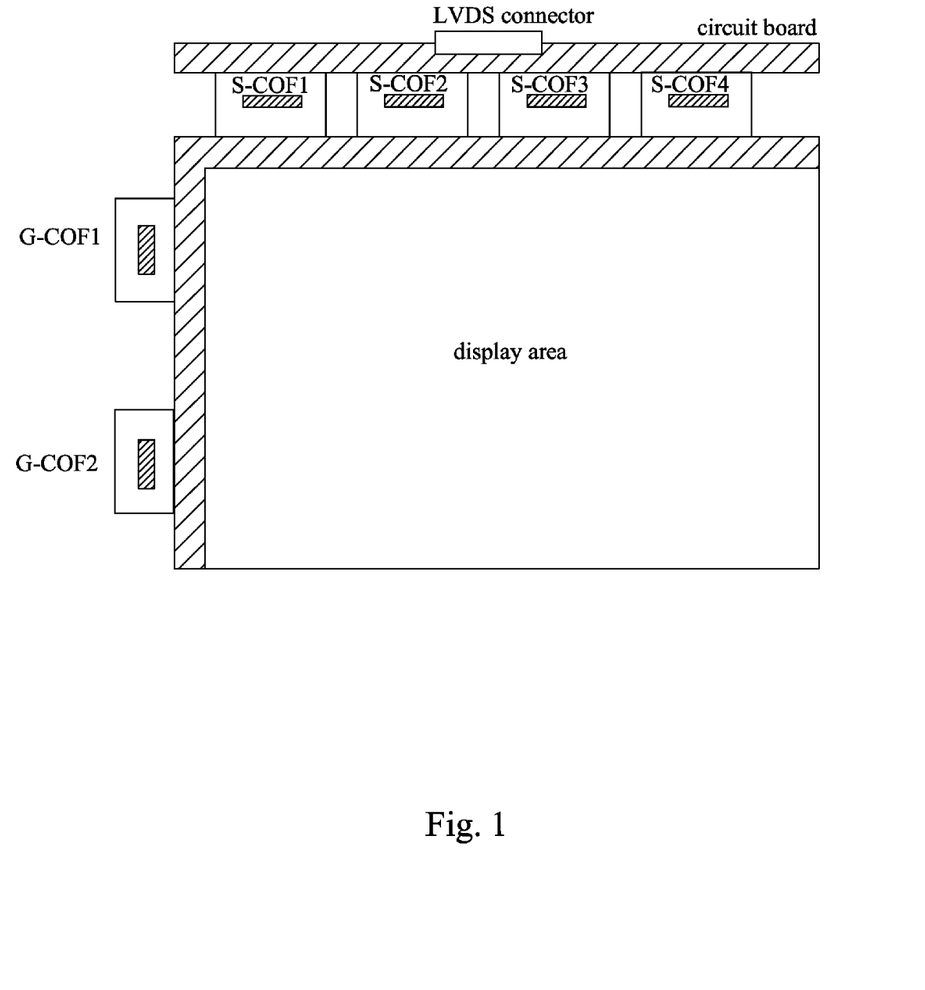
FIG. 1 is a schematic view illustrating the driving principle of a conventional TFT-LCD.

Referring to FIG. 1, which is a schematic view illustrating the essential driving principle of TFT-LCD, the principle is that a system PCB (Printed Circuit Board) applies R/G/B compression signal, control signal, and driving signal to connect with LVDS connector of a PCB via wires and the PCB adopts an arrangement of directly coupling an LVDS data processing chip IC to source terminal and gate terminal of a flexible printed circuit board (Source-Chip on Film, S-COF, and Gate-Chip on Film, G-COF) to connect with a display zone so as to uses the gate terminal and source terminal to allow the LCD to obtain necessary power and signal.

The signals that a liquid crystal display system using such a way of driving a display zone transmits to the PCB main board are generally of an LVDS format. Signals of the LVDS format are of relatively low voltage and relatively high accuracy and are relatively sensitive to voltage variation so that any static electricity may cause damage on the LVDS data processing chip IC. However, it is generally impossible to avoid generating static electricity during a process of component insertion and removal. Thus, to avoid any damage of the LVDS data processing chip IC caused by static electricity generated during an insertion and removal operation with respect to the LVDS connector, it is a general practice to make an arrangement of an ESD protection circuit for important signals at the connection between the LVDS connector and the LVDS data processing chip IC.

Figure 2:
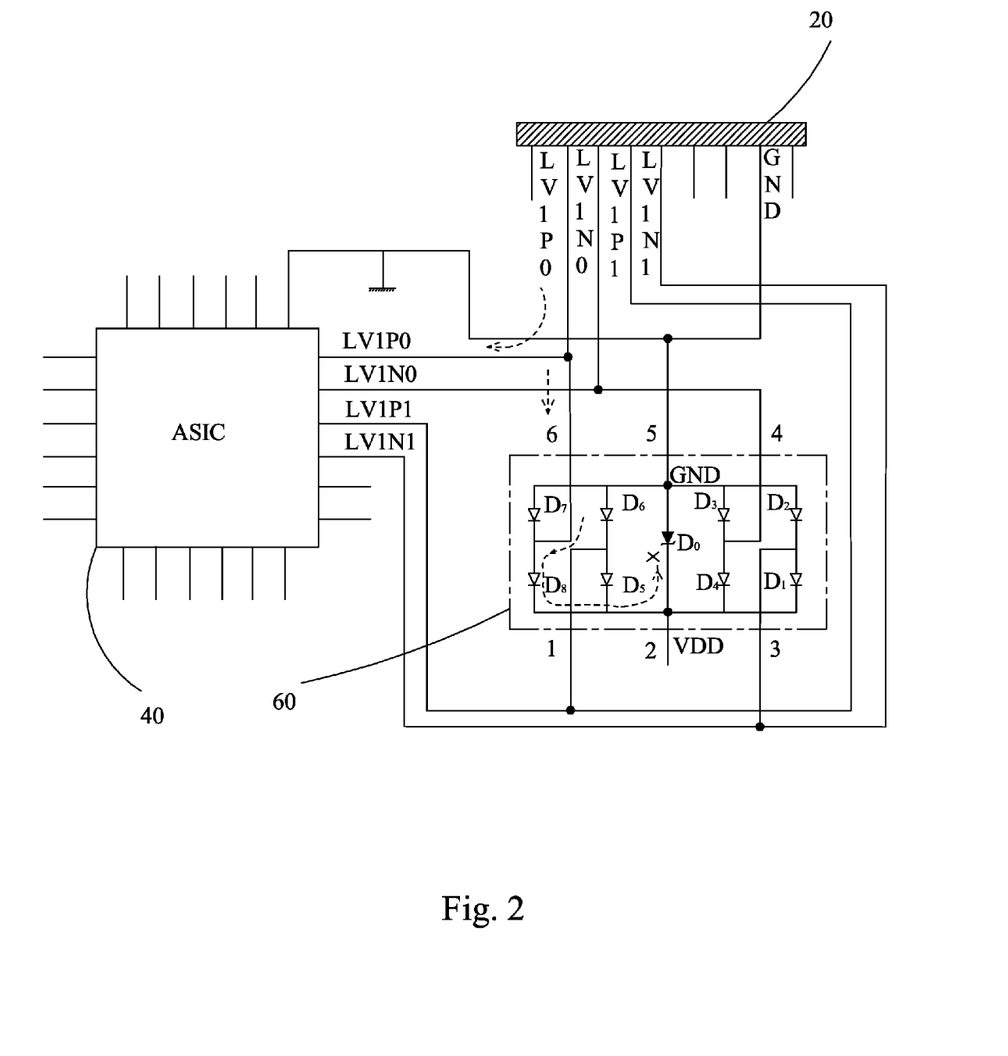
FIG. 2 is a schematic view showing normal connection of a conventional ESD protection chip of LVDS circuit.

As shown in FIG. 2, the ESD protection circuit is often comprised of an ESD protection chip 60. The ESD protection chip 60 comprises parallel connection of a voltage stabilizing diode and two serial-parallel structures that each comprise four diodes. For illustration of the effect of the ESD protection circuit, transmission of an LV1P0 signal from the LVDS connector 20 to the LVDS data processing chip IC 40 will be taken as an example. The LVDS connector 20 comprises an LV1P0 pin, an LV1N0 pin, an LV1P1 pin, and an LV1N1 pin, which are respectively connected to corresponding pins of the LVDS data processing chip IC 40, wherein the first pin LV1P0 is also connected to a branch of serial-parallel connection of the ESD protection chip 60. Similarly, the first opposite pin LV1N0 is also connected to another branch of serial-parallel connection of the ESD protection chip 60.

Under the assumption that the diodes constitute the ESD protection chip 60 are all of identical characteristics and forward conduction voltage drop is $U_{D+}$, while reveres cutoff voltage drop is $U_{D-}$, in an LVDS transmission circuit, with the voltage of a transmitted signal being U, $U_{D+} < U < U_{D-}$ (wherein a normal LVDS signal is around 1.2 v; $U_{D-}$ is 3 v; and $U_{D+}$ is 0.7 v). In a normal condition, when an normal LVDS signal is input through the LViP0 pin of the LVDS connector 20, since $U_{D-} > U$, diode $D_0$ of the ESD protection chip 60 is in a reverse cutoff condition. The voltage applied through the LV1P0 pin of the LVDS connector 20 cannot pass through the $D_0$ to form a loop with the GND pin of the LVDS connector 20. Thus, the voltage applied to the LV1P0 pin of the LVDS connector 20 is identical to the LV1P0 pin of the LVDS data processing chip IC 40. The signal transmission route is that shown in the drawing and the signal can be normally transmitted to the LV1P0 pin of the LVDS data processing chip IC 40.

Figure 3:
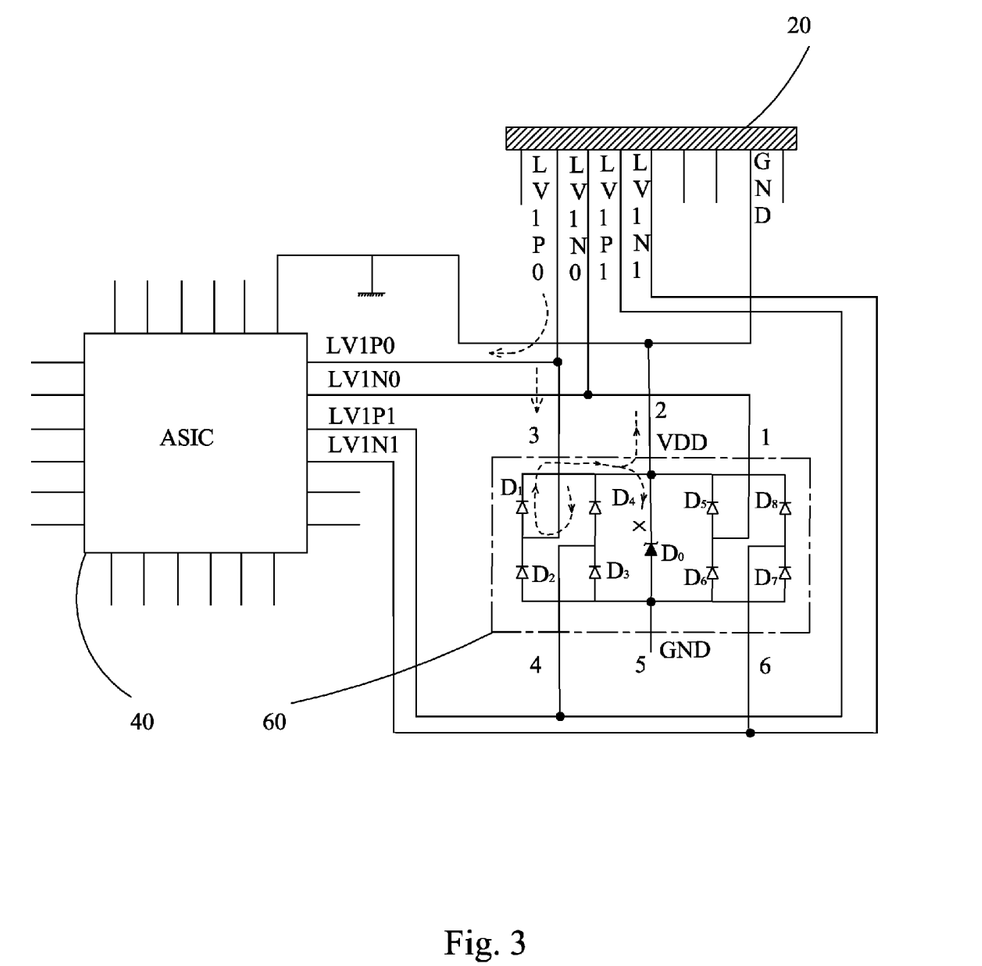
FIG. 3 is a schematic view showing abnormal, reversed connection of the conventional ESD protection chip of LVDS circuit.

As shown in FIG. 3, when the ESD protection chip 60 is soldered to the PCB in a reversed manner, a normal LVDS signal input through the LV1P0 pin of the LVDS connector 20 will flow through diode $D_1$ to the grounding line GND of the LVDS connector 20. Under this condition, the voltage of the LV1P0 pin of the LVDS data processing chip IC 40 is distorted and becomes the conduction voltage $U_{D+}$ of diode $D_1$, whereby the signal supplied to the display area of the display screen become abnormal, resulting in abnormality of image. Further, it is generally hard to identify front and back sides of the ESD protection chip so that it is difficult to visually distinguish an abnormally soldered product from normal products. This often results in shipping defect products to the client, causing damage of the client. Further, picking out abnormally soldered products takes a great effort and time and will cause an increase of manufacture cost.

SUMMARY OF THE INVENTION

An object of the present invention is to provide a digitally displaying inspection system of EST protection chip, wherein the inspection system can be used to inspect three signals of an LVDS connector so as to efficiently distinguish a normally soldered product from an abnormally soldered product and accurately identify abnormality position thereby saving effort and time and reducing manufacture cost and also prevent abnormally soldered products from being undesirably shipped to clients and causing damage of the clients.

To achieve the object, the present invention provides a digitally displaying inspection system for ESD protection chip, which comprises an LVDS connector, a display system, first, second, and third data lines, a power supply, and a resistor. The first, second, and third data lines each have an end electrically connected to the LVDS connector and an opposite end electrically connected to the display system. The resistor has an end electrically connected to the display system and an opposite end electrically connected to an end of the power supply. The power supply has an opposite end electrically connected to the LVDS connector. The display system comprises a logic operation module and a digital display module electrically connected to the logic operation module. The logic operation module is electrically connected to the first, second, and third data lines, whereby when an ESD protection chip is electrically connected to the LVDS connector, the logic operation module samples signals of the first, second, and third data lines and drives, after carrying out logic operation, the digital display module to display character signs.

The display system comprises first to fourth pins. The first data line has an end electrically connected to the first pin of the display system. The second data line has an end electrically connected to the second pin of the display system. The third data line has an end electrically connected to the third pin of the display system. The resistor has an end electrically connected to the fourth pin of the display system.

The LVDS connector comprises a fifth pin, a fifth opposite pin, a sixth pin, and a grounding pin. The first data line has an opposite end electrically connected to the fifth pin. The second data line has an opposite end electrically connected to the fifth opposite pin. The third data line has an opposite end electrically connected to the sixth pin.

The power supply has a positive terminal and a negative terminal. The resistor has an opposite end electrically connected to the positive terminal of the power supply and the negative terminal of the power supply is connected to the grounding pin of the LVDS connector so that the power supply, the resistor, the display system, the ESD protection chip, and the LVDS connector collectively form a loop.

The digital display module comprises a seven-segment common-anode digital display. The digital display module comprises seventh to thirteenth pins. The logic operation module applies digital signals A-G to the seventh to thirteenth pins respectively. The digital display module displays different characters according to the digital signals A-G.

The seven-segment common-anode digital display comprises seven display segments a-g. The digital signals A-G respectively correspond to the seven display segments a-g.

Character signs displayable on the digital display module include 1, 2, 3, and 5, whereby when the first data line is individually closed, the digital display module display character sign 1; when the second data line is individually closed, the digital display module displays character sign 2; when the third data line is individually closed, the digital display module displays character sign; and when multiple data lines are closed simultaneously, the digital display module displays character sign 5.

The logic operation module comprises a plurality of digital logic operation units of NOT gates, OR gates, and AND gates. The logic operation module uses signals of the first to third data lines to generate digital signals A-G.

The digital signal that the logic operation module samples on the first data line is marked X, the digital signal that the logic operation module samples on the second data line is marked Y, and the digital signal that the logic operation module samples on the third data line is marked Z. The digital signals A-G generated by the logic operation module satisfy the following relationships:

$A = \overline{Y} + Z,$ $B = \overline{X}YZ + X\overline{Y}Z + XY\overline{Z},$ $C = \overline{X} + Z,$ $D = \overline{Y} + Z,$ $E = \overline{X}YZ,$ $F = \overline{X}Y + \overline{X}Z + YZ,$ $G = \overline{Y} + Z.$ Digital signal $\overline{X}$ is obtained by a NOT gate of the logic operation module carrying out an operation on the digital signal X, digital signal $\overline{Y}$ is obtained by a NOT gate of the logic operation module carrying out an operation on the digital signal Y, and digital signal $\overline{Z}$ is obtained by a NOT gate of the logic operation module carrying out an operation on the digital signal Z.

The present invention also provides a digitally displaying inspection system for ESD protection chip, which comprises an LVDS connector, a display system, first, second, and third data lines, a power supply, and a resistor, the first, second, and third data lines each having an end electrically connected to the LVDS connector and an opposite end electrically connected to the display system, the resistor having an end electrically connected to the display system and an opposite end electrically connected to an end of the power supply, the power supply having an opposite end electrically connected to the LVDS connector, the display system comprising a logic operation module and a digital display module electrically connected to the logic operation module, the logic operation module being electrically connected to the first, second, and third data lines, whereby when an ESD protection chip is electrically connected to the LVDS connector, the logic operation module samples signals of the first, second, and third data lines and drives, after carrying out logic operation, the digital display module to display character signs;

wherein the display system comprises first to fourth pins, the first data line having an end electrically connected to the first pin of the display system, the second data line having an end electrically connected to the second pin of the display system, the third data line having an end electrically connected to the third pin of the display system, the resistor having an end electrically connected to the fourth pin of the display system;

wherein the LVDS connector comprises a fifth pin, a fifth opposite pin, a sixth pin, and a grounding pin, the first data line having an opposite end electrically connected to the fifth pin, the second data line having an opposite end electrically connected to the fifth opposite pin, the third data line having an opposite end electrically connected to the sixth pin;

wherein the power supply has a positive terminal and a negative terminal, the resistor having an opposite end electrically connected to the positive terminal of the power supply, the negative terminal of the power supply being connected to the grounding pin of the LVDS connector so that the power supply, the resistor, the display system, the ESD protection chip, and the LVDS connector collectively form a loop;

wherein the digital display module comprises a seven-segment common-anode digital display, the digital display module comprising seventh to thirteenth pins, the logic operation module applying digital signals A-G to the seventh to thirteenth pins respectively, the digital display module displaying different characters according to the digital signals A-G;

wherein the seven-segment common-anode digital display comprises seven display segments a-g, the digital signals A-G respectively corresponding to the seven display segments a-g;

wherein character signs displayable on the digital display module include 1, 2, 3, and 5, whereby when the first data line is individually closed, the digital display module display character sign 1; when the second data line is individually closed, the digital display module displays character sign 2; when the third data line is individually closed, the digital display module displays character sign; and when multiple data lines are closed simultaneously, the digital display module displays character sign 5;

wherein the logic operation module comprises a plurality of digital logic operation units of NOT gates, OR gates, and AND gates, the logic operation module using signals of the first to third data lines to generate digital signals A-G;

wherein the digital signal that the logic operation module samples on the first data line is marked X, the digital signal that the logic operation module samples on the second data line is marked Y, and the digital signal that the logic operation module samples on the third data line is marked Z, the digital signals A-G generated by the logic operation module satisfying the following relationships:

$A = \overline{Y} + Z,$ $B = \overline{X}YZ + X\overline{Y}Z + XY\overline{Z},$ $C = \overline{X} + Z,$ $D = \overline{Y} + Z$, $E = \overline{XYZ}$, $F = \overline{XY} + \overline{XZ} + \overline{YZ}$, $G = \overline{Y} + \overline{Z}$; and wherein digital signal $\overline{X}$ is obtained by a NOT gate of the logic operation module carrying out an operation on the digital signal X, digital signal $\overline{Y}$ is obtained by a NOT gate of the logic operation module carrying out an operation on the digital signal Y, and digital signal $\overline{Z}$ is obtained by a NOT gate of the logic operation module carrying out an operation on the digital signal Z.

The efficacy of the present invention is that the present invention provides a digitally displaying inspection system for ESD protection chip, which inspects three signals on the pins of an LVDS connector and transmits sampled signals to an logic operation module for logic operations so as to cause corresponding ones of diodes of a digital display to light and thus display different character signs, whereby with the character signs displayed on the digital display, it can determined if soldering is made on an ESD protection chip of the LVDS connector is correct, and normally soldered products can be efficiently distinguished from abnormally soldered products and abnormality position can be accurately identified so a to save effort and time, reduce manufacture cost, and prevent abnormally soldered products from being shipped to clients to cause damages of the clients. Further, the system can be expanded to a multiple-channel inspection system.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 4:
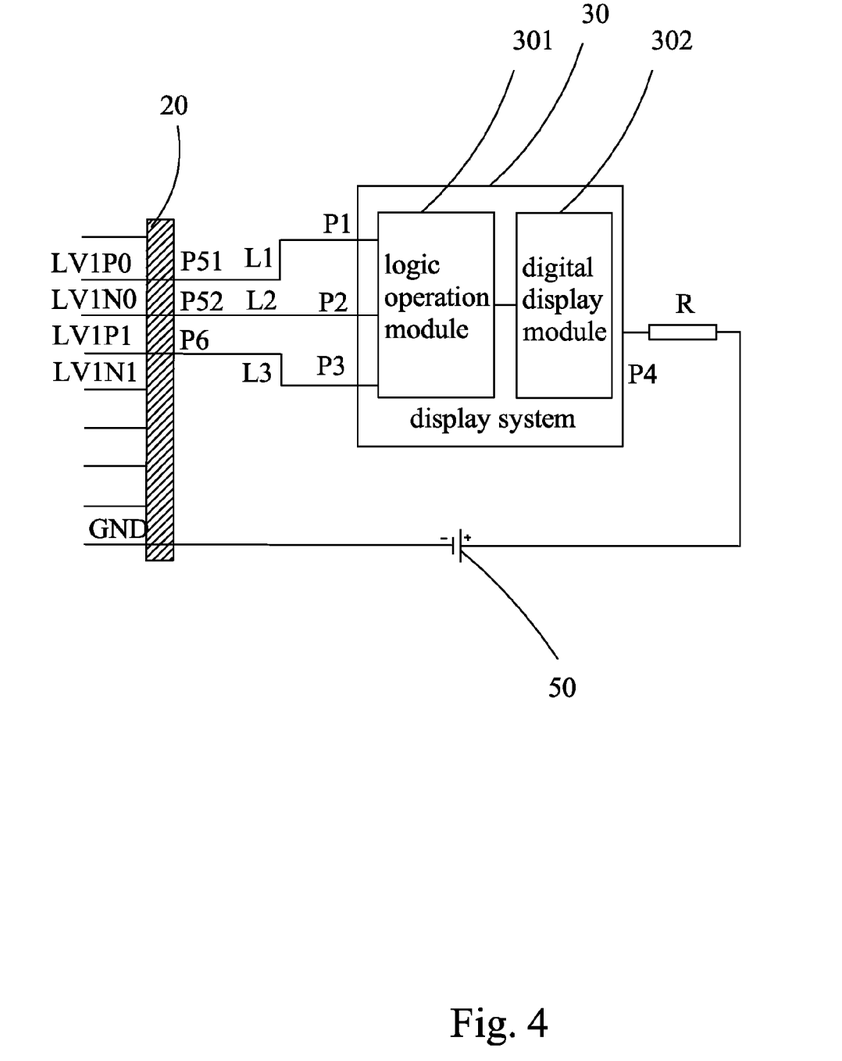
FIG. 4 is a schematic view showing a digitally displaying inspection system for ESD protection chip according to the present invention.
Figure 5:
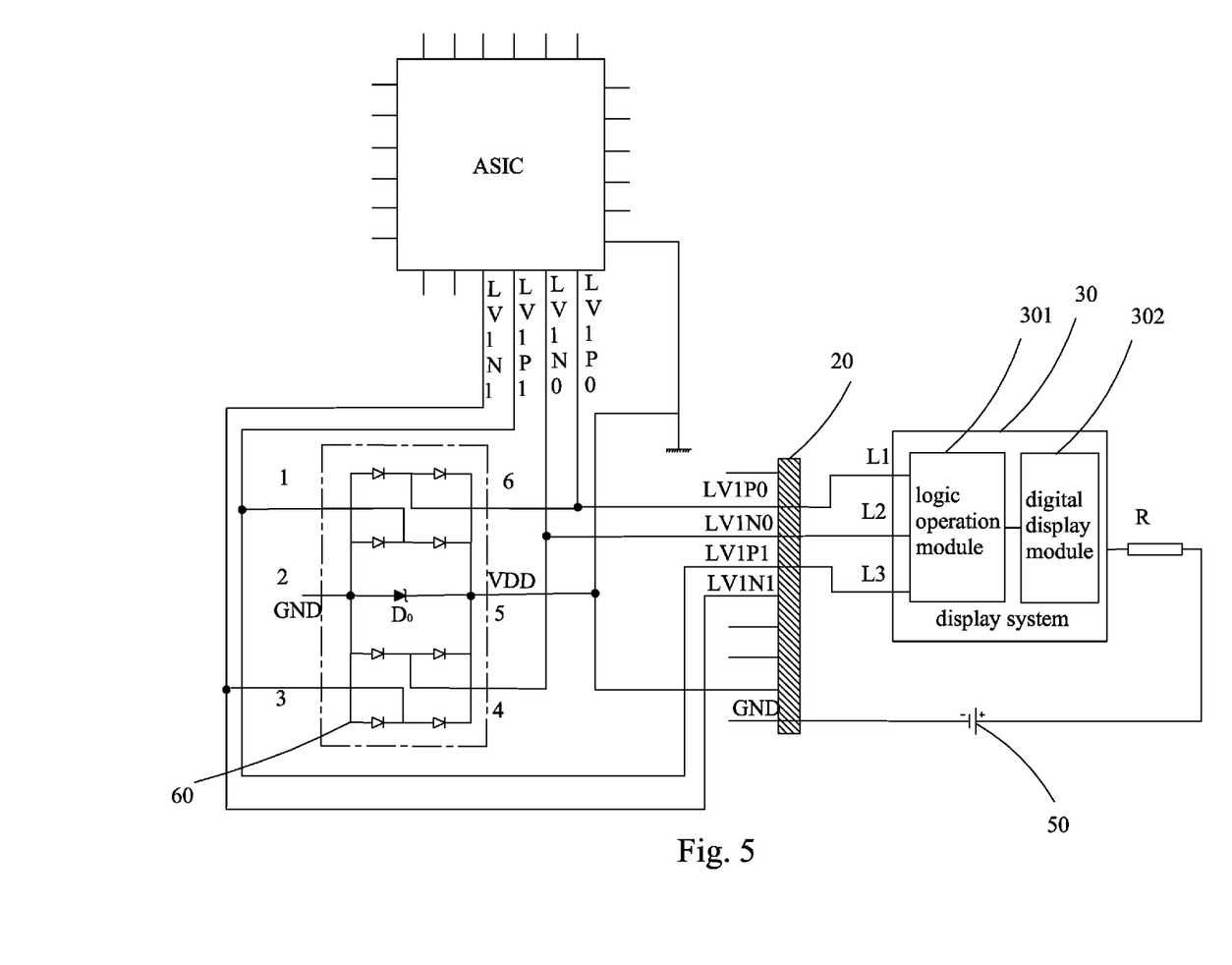
FIG. 5 is a schematic view showing connection of the digitally displaying inspection system for ESD protection chip according to the present invention with an ESD protection chip.

Referring to FIGS. 4 and 5, the present invention provides a digitally displaying inspection system for ESD protection chip, which comprises an LVDS connector 20, a display system 30, a first data line L1, a second data line L2 and a third data line L3 that each have an end electrically connected to the LVDS connector 20 and an opposite end electrically connected to the display system 30, a power supply 50, and a resistor R having an end electrically connected to the display system 30 and an opposite end electrically connected to the power supply 50. The power supply 50 is electrically connected to the LVDS connector 20. The display system 30 comprises a logic operation module 301 and a digital display module 302 electrically connected to the logic operation module 301. The logic operation module 301 is electrically connected to the first data line L1, the second data line L2, and the third data line L3. When an ESD protection chip 60 is electrically connected to the LVDS connector 20, the logic operation module 301 samples signals on the first data line L1, the second data line L2, and the third data line L3 and drives, after carrying out logic operations, the digital display module 302 to display character signs. A user may determine if the ESD protection chip 60 is correctly soldered according to the character signs displayed on the digital display module 302 so as to save effort and time, increase working efficiency, and reduce manufacture cost.

The display system 30 comprises first to fourth pins P1-P4. The LVDS connector 20 comprises a fifth pin P51, a fifth opposite pin P52, a sixth pin P6, and a grounding pin GND. The power supply 50 has a positive terminal and a negative terminal.

The first data line L1 has an end electrically connected to the first pin P1 of the display system 30 and an opposite end electrically connected to the fifth pin P51. The second data line L2 has an end electrically connected to the second pin P2 of the display system 30 and an opposite end electrically connected to the fifth opposite pin P52. The third data line L3 has an end electrically connected to the third pin P3 of the display system 30 and an opposite end electrically connected to the sixth pin P6. The resistor R has an end electrically connected to the fourth pin P4 of the display system 30 and an opposite end electrically connected to the positive terminal of the power supply 50. The negative terminal of the power supply 50 is electrically connected to the grounding pin GND of the LVDS connector 20 so that the power supply 50, the resistor R, the display system 30, the ESD protection chip 60, and the LVDS connector 20 collectively form a loop, where the power supply 50 drives the digital display module 302 of the display system 30 to display character signs.

The logic operation module 301 comprises a plurality of digital logic operation units of NOT gates 304, OR gates 305, and AND gates 306. The logic operation module 301 uses the signals of the first to third data lines L1-L3 to generate digital signals of A to G.

When the ESD protection chip 60 is electrically connected to the LVDS connector 20, the logic operation module 301 samples analog signals X', Y', and Z' on the first to third data lines L1-L3.

With the background techniques described above being incorporated here, when the ESD protection chip 60 is correctly soldered, in an inspection, the electrical voltage on the fifth pin P51 of the LVDS connector 20 is the voltage of the power supply 50. In the instant embodiment, the voltage of the power supply 50 is taken as a value of 1.2V. When the ESD protection chip 60 is incorrectly soldered, the electrical voltage on the fifth pin P51 is the forward conduction voltage $U_{D+}=0.7V$ of a diode. Thus, a standard voltage can be picked between 0.7V and the voltage of the power supply 50 to serve as a reference voltage standard for the logic operation module to convert an analog signal into a digital signal. In the instant preferred embodiment, a preferable standard voltage is 0.95V. The following description is given by taking the standard voltage being 0.95V as an example:

When the voltage of the first data line L1 is greater than 0.95V, it is considered the line is normally working in the LVDS communication mode. When the voltage of the first data line L1 is less than 0.95V, it is considered that the ESD protection chip 60 of the line is of incorrect connection.

(A) When X'<0.95V, it means that the fifth pin P51 of the LVDS connector 20 that is connected to the first data line L1 is abnormal, the first data line L1 is closed, and the digital signal obtained from the analog signal that the logic operation module 301 samples on the first data line L1 is 1; and when X'>0.95V, it means that the fifth pin P51 of the LVDS connector 20 that is connected to the first data line L1 is normal, the first data line L1 is open, and the digital signal obtained from the analog signal that the logic operation module 301 samples on the first data line L1 is 0.

The digital signal of the first data line L1 is marked X and digital signal $\overline{X}$ is obtained by a NOT gate 304 of the logic operation module 301 carrying out a NOT operation on the digital signal X.

(B) When Y'<0.95V, it means that the fifth opposite pin P52 of the LVDS connector 20 that is connected to the second data line L2 is abnormal, the second data line L2 is closed, and the digital signal obtained from the analog signal that the logic operation module 301 samples on the second data line is 1; and when Y'>0.95V, it means that the fifth opposite pin P52 of the LVDS connector 20 that is connected to the second data line L2 is normal, the second data line L2 is open, and the digital signal obtained from the analog signal that the logic operation module 301 samples on the second data line is 0.

The digital signal of the second data line L2 is marked Y and digital signal $\overline{Y}$ is obtained by a NOT gate 304 of the logic operation module 301 carrying out a NOT operation on the digital signal Y.

(C) When Z'<0.95V, it means that the sixth opposite pin P6 of the LVDS connector 20 that is connected to the third data line L3 is abnormal, the third data line L3 is closed, and the digital signal obtained from the analog signal that the logic operation module 301 samples on the third data line L3 is 1; and when Z'>0.95V, it means that the sixth pin P6 of the LVDS connector 20 that is connected to the third data line L3 is normal, the third data line L2 is open, and the digital signal obtained from the analog signal that the logic operation module 301 samples on the third data line L3 is 0.

The digital signal of the third data line L3 is marked Z and digital signal $\overline{Z}$ is obtained by a NOT gate 304 of the logic operation module 301 carrying out a NOT operation on the digital signal Z.

The digital signals A-G that are generated by the logic operation module 301 according to input signals and the above definitions satisfy the following relationships:

$A=\overline{Y+Z}$, $B=\overline{\overline{X}YZ+\overline{X}Y\overline{Z}+X\overline{Y}\overline{Z}}$, $C=\overline{\overline{X}+Z}$, $D=\overline{Y+Z}$, $E=\overline{\overline{X}YZ}$, $F=\overline{XY+XZ+YZ}$, $G=\overline{Y+Z}$.

The generation of digital signals B and C will taken as an example for illustrating the logic connection relationship thereof with the input digital signals, X, Y, Z of the logic operation input module.

Figure 6:
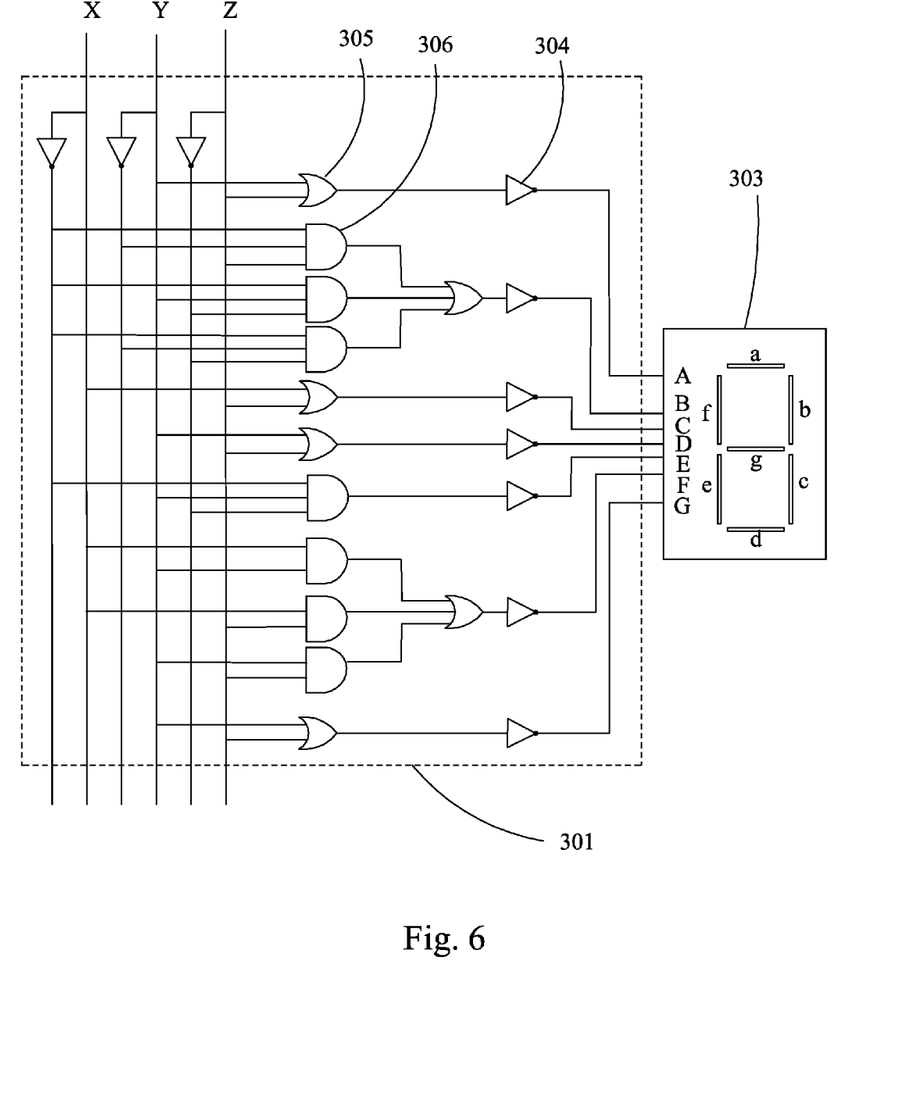
FIG. 6 is a schematic view showing the circuit of a logic operational module of the digitally displaying inspection system for ESD protection chip according to the present invention.

Also referring to FIG. 6, firstly, the X, Y, Z signals are connected in parallel with a logic operation unit of NOT gate 304 to generates the signals $\overline{X}$, $\overline{Y}$, $\overline{Z}$.

Generation of digital signal A: an OR gate logic operation unit 305 is applied to carry out an OR operation on singles of Y and Z and then a NOT gate logic operation unit 304 is applied to carry out a NOT operation so as to obtain digital signal A.

Generation of digital signal B: an AND gate logic operation unit is applied to carry out an AND operation on signals $\overline{X}$, Y, and Z to generate a digital signal h, an AND gate logic operation unit 306 carries out an AND operation on signals $\overline{X}$, Y, and $\overline{Z}$ to generate a digital signal i, an AND gate logic operation unit 306 carries out an AND operation on signals X, $\overline{Y}$, and $\overline{Z}$ to generate a digital signal j, and then the signals h, i, and j are fed to an OR gate logic operation unit 305 and then fed through a NOT gate logic operation unit 304 to subjected to an NOT operation so as to obtain digital signal B.

Generation of digital signal C: an OR gate logic operation unit 305 is applied to carry out an OR operation on signals $\overline{X}$ and Z and then a NOT gate logic operation unit 304 is applied to carry out a NOT operation so as to obtain digital signal C.

Generation of digital signal D: an OR gate logic operation unit 305 is applied to carry out an OR operation on singles of Y and Z and then a NOT gate logic operation unit 304 is applied to carry out a NOT operation so as to obtain digital signal D.

Generation of digital signal E: an AND gate logic operation unit is applied to carry out an AND operation on signals $\overline{X}$, Y, and Z and then a NOT gate logic operation unit 304 is applied to carry out a NOT operation so as to obtain digital signal E.

Generation of digital signal F: an AND gate logic operation unit is applied to carry out an AND operation on signals X and Y to generate a digital signal k, an AND gate logic operation unit 306 carries out an AND operation on signals X and Z to generate a digital signal l, an AND gate logic operation unit 306 carries out an AND operation on signals Y and Z to generate a digital signal m, and then the signals k, l, and m are fed to an OR gate logic operation unit 305 and then fed through a NOT gate logic operation unit 304 to subjected to an NOT operation so as to obtain digital signal F.

Generation of digital signal G: an OR gate logic operation unit is applied to carry out an OR operation on singles of Y and Z and then a NOT gate logic operation unit 304 is applied to carry out a NOT operation so as to obtain digital signal G.

The digital display module 302 comprises a seven-segment common-anode digital display 303. The digital display module 302 comprises seventh to thirteenth pins. The logic operation module 301 applies digital signals A-G to the seventh to thirteenth pins respectively and the digital display module 302 displays different characters according to the digital signals A-G.

The digital display 303 comprises seven display segments a-g and the digital signals A-G respectively drive the segments a-g to display. Since the segment display is of common anode, when A=0, display segment a light and similarly, when B=0, display segment b lights and this is also applicable to segments c, d, e, f, g.

The character signs displayable on the digital display module 302 include 1, 2, 3, and 5. When the first data line L1 is individually closed, the digital display module 302 display character sign 1; when the second data line L2 is individually closed, the digital display module 302 displays character sign 2; when the third data line L3 is individually closed, the digital display module 302 displays character sign 3; and when multiple data lines are closed simultaneously (any two of the three data lines or all three data lines being simultaneously closed), the digital display module 302 displays character sign 5.

The first data line L1 being individually closed to become ON is taken as an example for illustrating the digital display displaying character sign 1. When the first data line L1 is individually closed, namely $X=1$, $\overline{X}=0$; $Y=0$, $\overline{Y}=1$; and $Z=0$, $\overline{Z}=1$, then $$A=\overline{Y}+\overline{Z}=1,$$

$$B=\overline{XYZ}+\overline{X}Y\overline{Z}+\overline{X}\overline{Y}Z=0,$$

$$C=\overline{X}+\overline{Z}=0,$$

$$D=\overline{Y}+\overline{Z}=1,$$

$$E=\overline{X}Y\overline{Z}=1,$$

$$F=\overline{XY}+\overline{XZ}+\overline{YZ}=1,$$

$$G=\overline{Y}+\overline{Z}=1.$$

When $B=0$ and $C=0$, segments b and c of the seven-segment digital display 303 satisfy the essential conditions of common anode displaying and form, together with a common electrode, a loop to be lit. Under this condition, segments b and c collectively display character sign 1.

The inspection system of the present invention is not limited to inspection of three channels and can be expanded as multiple channel inspection system.

In summary, the present invention provides a digitally displaying inspection system for ESD protection chip, which inspects three signals on the pins of an LVDS connector and transmits sampled signals to an logic operation module for logic operations so as to cause corresponding ones of diodes of a digital display to light and thus display different character signs, whereby with the character signs displayed on the digital display, it can determined if soldering is made on an ESD protection chip of the LVDS connector is correct, and normally soldered products can be efficiently distinguished from abnormally soldered products and abnormality position can be accurately identified so a to save effort and time, reduce manufacture cost, and prevent abnormally soldered products from being shipped to clients to cause damages of the clients. Further, the system can be expanded to a multiple-channel inspection system.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A digitally displaying inspection system for ESD protection chip, comprising an LVDS connector, a display system, first, second, and third data lines, a power supply, and a resistor, the first, second, and third data lines each having an end electrically connected to the LVDS connector and an opposite end electrically connected to the display system, the resistor having an end electrically connected to the display system and an opposite end electrically connected to an end of the power supply, the power supply having an opposite end electrically connected to the LVDS connector, the display system comprising a logic operation module and a digital display module electrically connected to the logic operation module, the logic operation module being electrically connected to the first, second, and third data lines, whereby when an ESD protection chip is electrically connected to the LVDS connector, the logic operation module samples signals of the first, second, and third data lines and drives, after carrying out logic operation, the digital display module to display character signs.

2. The digitally displaying inspection system for ESD protection chip as claimed in claim 1, wherein the display system comprises first to fourth pins, the first data line having an end electrically connected to the first pin of the display system, the second data line having an end electrically connected to the second pin of the display system, the third data line having an end electrically connected to the third pin of the display system, the resistor having an end electrically connected to the fourth pin of the display system.

3. The digitally displaying inspection system for ESD protection chip as claimed in claim 2, wherein the LVDS connector comprises a fifth pin, a fifth opposite pin, a sixth pin, and a grounding pin, the first data line having an opposite end electrically connected to the fifth pin, the second data line having an opposite end electrically connected to the fifth opposite pin, the third data line having an opposite end electrically connected to the sixth pin.

4. The digitally displaying inspection system for ESD protection chip as claimed in claim 3, wherein the power supply has a positive terminal and a negative terminal, the resistor having an opposite end electrically connected to the positive terminal of the power supply, the negative terminal of the power supply being connected to the grounding pin of the LVDS connector so that the power supply, the resistor, the display system, the ESD protection chip, and the LVDS connector collectively form a loop.

5. The digitally displaying inspection system for ESD protection chip as claimed in claim 1, wherein the digital display module comprises a seven-segment common-anode digital display, the digital display module comprising seventh to thirteenth pins, the logic operation module applying digital signals A-G to the seventh to thirteenth pins respectively, the digital display module displaying different characters according to the digital signals A-G.

6. The digitally displaying inspection system for ESD protection chip as claimed in claim 5, wherein the seven-segment common-anode digital display comprises seven display segments a-g, the digital signals A-G respectively corresponding to the seven display segments a-g.

7. The digitally displaying inspection system for ESD protection chip as claimed in claim 5, wherein character signs displayable on the digital display module include 1, 2, 3, and 5, whereby when the first data line is individually closed, the digital display module display character sign 1; when the second data line is individually closed, the digital display module displays character sign 2; when the third data line is individually closed, the digital display module displays character sign; and when multiple data lines are closed simultaneously, the digital display module displays character sign 5.

8. The digitally displaying inspection system for ESD protection chip as claimed in claim 5, wherein the logic operation module comprises a plurality of digital logic operation units of NOT gates, OR gates, and AND gates, the logic operation module using signals of the first to third data lines to generate digital signals A-G.

9. The digitally displaying inspection system for ESD protection chip as claimed in claim 8, wherein the digital signal that the logic operation module samples on the first data line is marked X, the digital signal that the logic operation module samples on the second data line is marked Y, and the digital signal that the logic operation module samples on the third data line is marked Z, the digital signals A-G generated by the logic operation module satisfying the following relationships:

$$A=\overline{Y+Z},$$

$$B=\overline{\overline{X}YZ+X\overline{Y}Z+XY\overline{Z}},$$

$$C=\overline{X}+Z,$$

$$D=\overline{Y+Z},$$

$$E=\overline{X}Y\overline{Z},$$

$$F=\overline{XY+XZ+YZ},$$

$$G=\overline{Y+Z}.$$

10. The digitally displaying inspection system for ESD protection chip as claimed in claim 9, wherein digital signal $\overline{X}$ is obtained by a NOT gate of the logic operation module carrying out an operation on the digital signal X, digital signal $\overline{Y}$ is obtained by a NOT gate of the logic operation module carrying out an operation on the digital signal Y, and digital signal $\overline{Z}$ is obtained by a NOT gate of the logic operation module carrying out an operation on the digital signal Z.

11. A digitally displaying inspection system for ESD protection chip, comprising an LVDS connector, a display system, first, second, and third data lines, a power supply, and a resistor, the first, second, and third data lines each having an end electrically connected to the LVDS connector and an opposite end electrically connected to the display system, the resistor having an end electrically connected to the display system and an opposite end electrically connected to an end of the power supply, the power supply having an opposite end electrically connected to the LVDS connector, the display system comprising a logic operation module and a digital display module electrically connected to the logic operation module, the logic operation module being electrically connected to the first, second, and third data lines, whereby when an ESD protection chip is electrically connected to the LVDS connector, the logic operation module samples signals of the first, second, and third data lines and drives, after carrying out logic operation, the digital display module to display character signs;

wherein the display system comprises first to fourth pins, the first data line having an end electrically connected to the first pin of the display system, the second data line having an end electrically connected to the second pin of the display system, the third data line having an end electrically connected to the third pin of the display system, the resistor having an end electrically connected to the fourth pin of the display system;

wherein the LVDS connector comprises a fifth pin, a fifth opposite pin, a sixth pin, and a grounding pin, the first data line having an opposite end electrically connected to the fifth pin, the second data line having an opposite end electrically connected to the fifth opposite pin, the third data line having an opposite end electrically connected to the sixth pin;

wherein the power supply has a positive terminal and a negative terminal, the resistor having an opposite end electrically connected to the positive terminal of the power supply, the negative terminal of the power supply being connected to the grounding pin of the LVDS connector so that the power supply, the resistor, the display system, the ESD protection chip, and the LVDS connector collectively form a loop;

wherein the digital display module comprises a seven-segment common-anode digital display, the digital display module comprising seventh to thirteenth pins, the logic operation module applying digital signals A-G to the seventh to thirteenth pins respectively, the digital display module displaying different characters according to the digital signals A-G;

wherein the seven-segment common-anode digital display comprises seven display segments a-g, the digital signals A-G respectively corresponding to the seven display segments a-g;

wherein character signs displayable on the digital display module include 1, 2, 3, and 5, whereby when the first data line is individually closed, the digital display module display character sign 1; when the second data line is individually closed, the digital display module displays character sign 2; when the third data line is individually closed, the digital display module displays character sign; and when multiple data lines are closed simultaneously, the digital display module displays character sign 5;

wherein the logic operation module comprises a plurality of digital logic operation units of NOT gates, OR gates, and AND gates, the logic operation module using signals of the first to third data lines to generate digital signals A-G;

wherein the digital signal that the logic operation module samples on the first data line is marked X, the digital signal that the logic operation module samples on the second data line is marked Y, and the digital signal that the logic operation module samples on the third data line is marked Z, the digital signals A-G generated by the logic operation module satisfying the following relationships:

$$A=\overline{Y+Z},$$

$$B=\overline{\overline{X}YZ+X\overline{Y}Z+XY\overline{Z}},$$

$$C=\overline{X}+Z,$$

$$D=\overline{Y+Z},$$

$$E=\overline{X}Y\overline{Z},$$

$$F=\overline{XY+XZ+YZ},$$

$$G=\overline{Y+Z}; \text{ and}$$

wherein digital signal $\overline{X}$ is obtained by a NOT gate of the logic operation module carrying out an operation on the digital signal X, digital signal $\overline{Y}$ is obtained by a NOT gate of the logic operation module carrying out an operation on the digital signal Y, and digital signal $\overline{Z}$ is obtained by a NOT gate of the logic operation module carrying out an operation on the digital signal Z.

* * * * *